US012696010B2

(12) United States Patent
Hsu et al.

(10) Patent No.: US 12,696,010 B2
(45) Date of Patent: Jul. 28, 2026

(54) IMAGE SENSING CIRCUIT AND COMPARATOR THEREOF

(71) Applicant: NOVATEK Microelectronics Corp., Hsin-Chu (TW)

(72) Inventors: Pai-Hsiang Hsu, Hsinchu City (TW); Yueh-Ru Lee, Hsinchu City (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 345 days.

(21) Appl. No.: 18/216,606

(22) Filed: Jun. 30, 2023

(65) Prior Publication Data

US 2025/0008242 A1      Jan. 2, 2025

(51) Int. Cl.
*H04N 25/78*        (2023.01)
*H03K 5/24*         (2006.01)

(52) U.S. Cl.
CPC ........... *H04N 25/78* (2023.01); *H03K 5/2472* (2013.01)

(58) Field of Classification Search
CPC ...... H04N 25/78; H04N 25/617; H04N 25/76; H03K 5/2472; H03K 5/2481
See application file for complete search history.

(56) References Cited

U.S. PATENT DOCUMENTS

2013/0215302 A1*  8/2013  Ueno .................. H03M 1/0863
                                                    348/300
2019/0082134 A1   3/2019  Ushinaga
2020/0162067 A1*  5/2020  Kim .................... G11C 27/026
2022/0201231 A1*  6/2022  Ebihara .................. H03K 5/24
2023/0300485 A1*  9/2023  Nakagawa ........... H04N 25/709
2023/0345144 A1*  10/2023 Awatani ................ H04N 25/00
2023/0412942 A1*  12/2023 Tomita .................. H04N 25/77

* cited by examiner

*Primary Examiner* — Nhan T Tran
(74) *Attorney, Agent, or Firm* — Winston Hsu

(57)                ABSTRACT
A comparator includes an input stage, a gain stage, an output stage and a clamp circuit. The input stage receives an input signal and a ramp signal and generates a first output signal. The gain stage, coupled to the input stage, receives the first output signal and generates a second output signal. The output stage, coupled to the gain stage, receives the second output signal and generates a third output signal. The clamp circuit, coupled to the gain stage and the output stage.

27 Claims, 10 Drawing Sheets

IMAGE SENSING CIRCUIT AND COMPARATOR THEREOF

BACKGROUND OF THE INVENTION

1. Field of the Invention

The present invention relates to an image sensing circuit, and more particularly, to an image sensing circuit having a novel comparator structure.

2. Description of the Prior Art

An image sensor, as a device capable of converting optical images into electronic signals, is widely applied in various electronic products such as digital cameras, medical image products, monitoring equipment and video telephones. Currently available image sensors are divided into charge coupled device (CCD) image sensors and complementary metal oxide semiconductor (CMOS) image sensors. With advances in integrated circuit process technology, the CMOS image sensor has become more popular than the CCD image sensor in the market.

In recent years, the frame rate and resolution of image sensors keep increasing, and thus the corresponding image sensing circuit is requested to have more comparators to deal with an increasing number of input image signals. Since these comparators receive the image signals and perform comparisons simultaneously, the state transitions of these comparators may cause a large peak current, resulting in an unwanted IR-drop on the power supply voltage for the comparators and generating a non-ignorable electromagnetic interference (EMI).

SUMMARY OF THE INVENTION

It is therefore an objective of the present invention to provide an image sensing circuit having a novel comparator structure, in order to solve the abovementioned problems.

An embodiment of the present invention discloses a comparator, which comprises an input stage, a gain stage, an output stage and a clamp circuit. The input stage receives an input signal and a ramp signal and generates a first output signal. The gain stage, coupled to the input stage, receives the first output signal and generates a second output signal. The output stage, coupled to the gain stage, receives the second output signal and generates a third output signal. The clamp circuit is coupled to the gain stage and the output stage.

Another embodiment of the present invention discloses an image sensing circuit having a plurality of input channels. The image sensing circuit comprises a ramp generator and a plurality of comparators. The ramp generator generates a ramp signal. Each of the plurality of comparators comprises an input stage, a gain stage, an output stage and a clamp circuit. The input stage, coupled to the ramp generator and one of the plurality of input channels, receives an input signal from the coupled input channel and receives the ramp signal from the ramp generator, and generates a first output signal. The gain stage, coupled to the input stage, receives the first output signal and generates a second output signal. The output stage, coupled to the gain stage, receives the second output signal and generates a third output signal. The clamp circuit is coupled to the gain stage and the output stage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
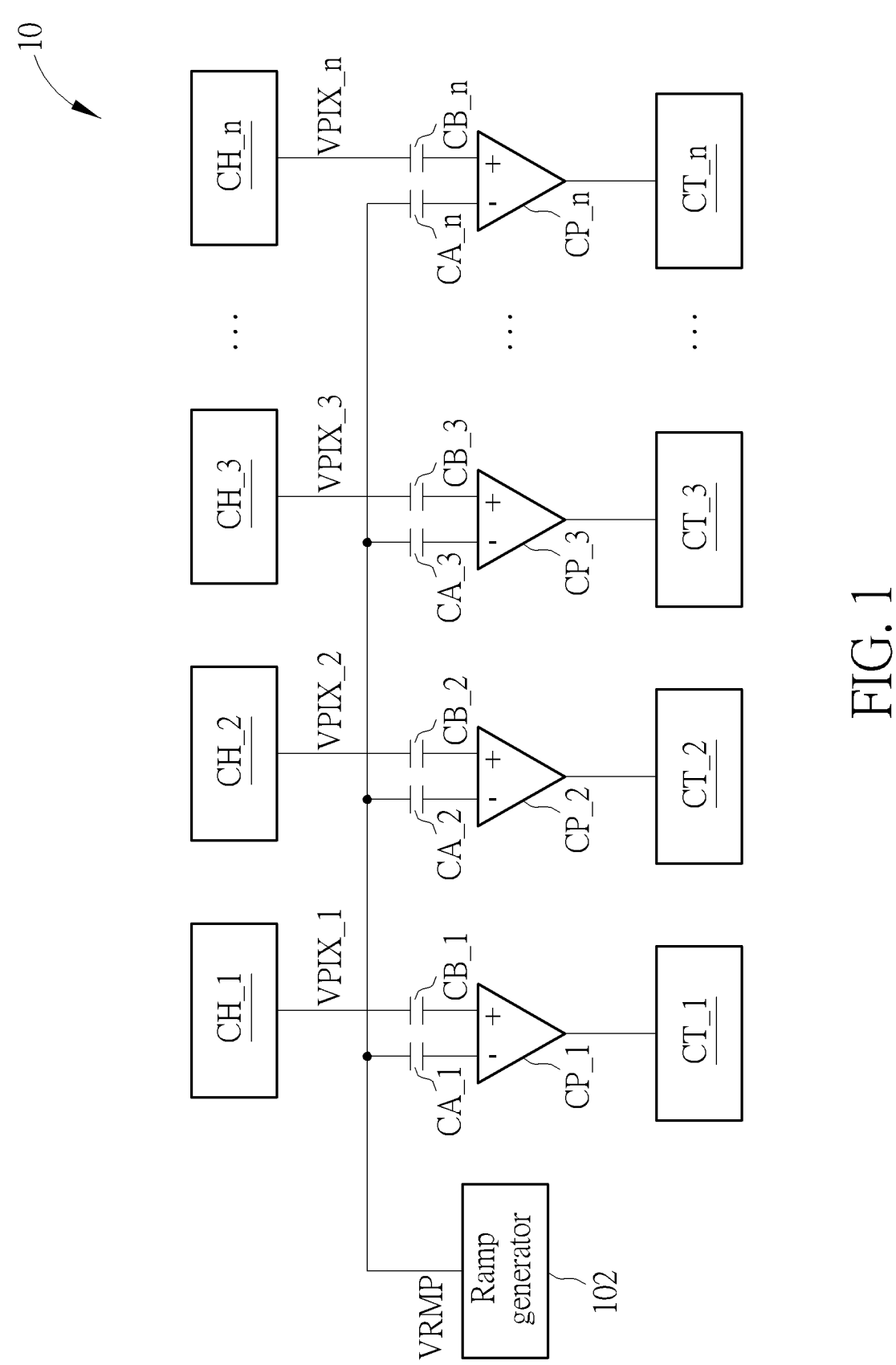
FIG. 1 is a schematic diagram of an image sensing circuit according to an embodiment of the present invention.

FIG. 1 is a schematic diagram of an image sensing circuit 10 according to an embodiment of the present invention. The image sensing circuit 10 has multiple input channels CH_1-CH_n, for receiving input image signals VPIX_1-VPIX_n through the input channels CH_1-CH_n, respectively. For example, the image sensing circuit 10 may be implemented in a readout circuit to be coupled to an image sensor array, and each input channel CH_1-CH_n may receive the input image signals VPIX_1-VPIX_n from a row or column of sensing pixels in the image sensor.

In detail, the image sensing circuit 10 includes a ramp generator 102, a plurality of comparators CP_1-CP_n, a plurality of counters CT_1-CT_n, and a plurality of capacitors CA_1-CA_n and CB_1-CB_n. The ramp generator 102 is configured to generate a ramp signal VRMP and provide the ramp signal VRMP for the comparators CP_1-CP_n to perform comparison. As for each comparator CP_1-CP_n, the positive input terminal is coupled to the corresponding input channel CH_1-CH_n through the capacitors CB_1-CB_n, respectively, for receiving the corresponding image signals VPIX_1-VPIX_n, and the negative input terminal is coupled to the ramp generator 102 through the capacitors CA_1-CA_n, respectively, for receiving the ramp signal VRMP. The comparators CP_1-CP_n are configured to compare the image signals VPIX_1-VPIX_n with the ramp signal VRMP to generate comparison results. The counters CT_1-CT_n, which are coupled to the output terminal of the corresponding comparators CP_1-CP_n, respectively, then output counting results that reflect the image signals VPIX_1-VPIX_n according to the comparison results.

Figure 2:
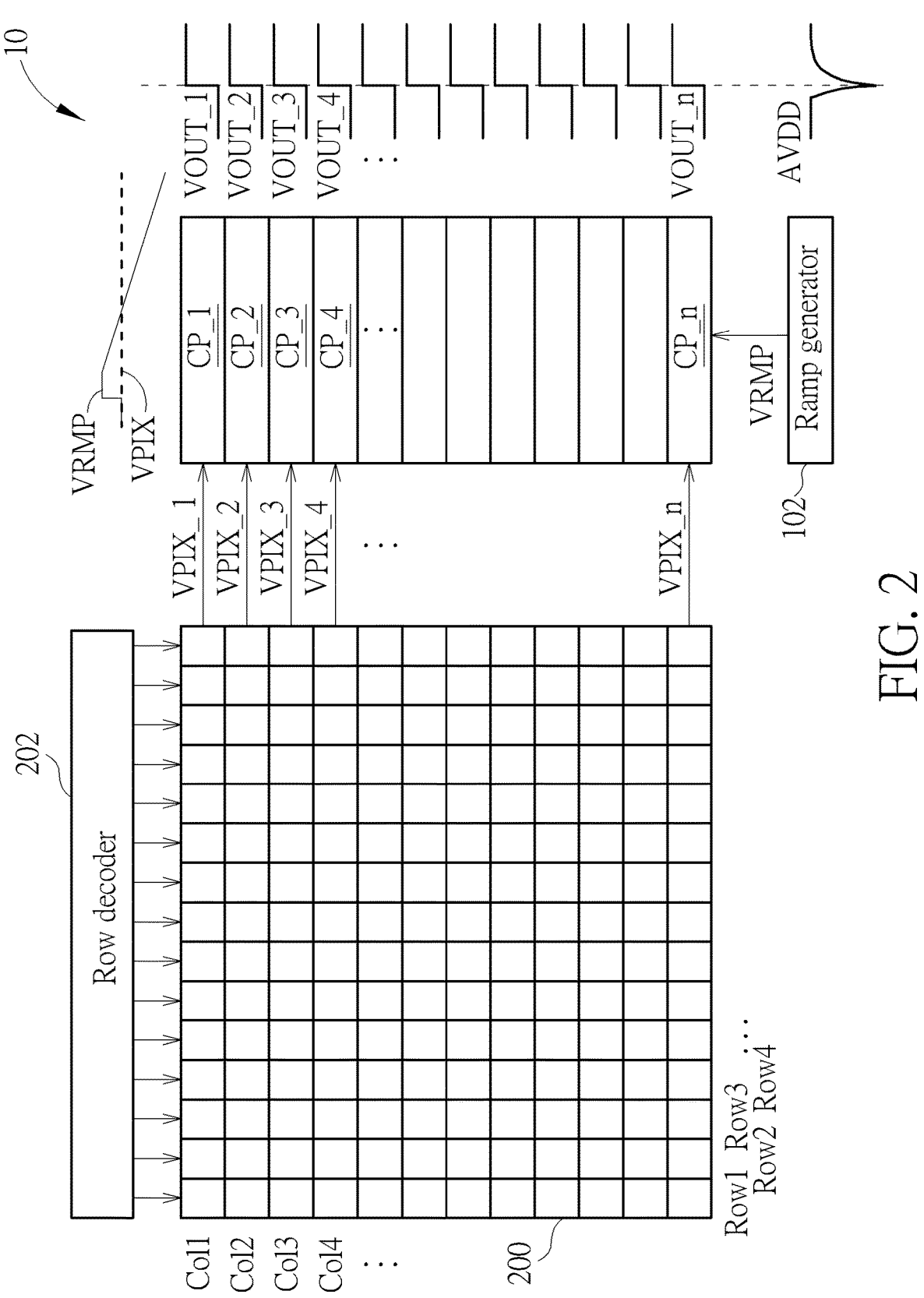
FIG. 2 illustrates the image sensing circuit receiving image signals from a sensing pixel array of an image sensor.

As mentioned above, the image sensing circuit 10 may be coupled to an image sensor array. For example, as shown in FIG. 2, an image sensor 200 may include an array of sensing pixels, of which the image signals VPIX_1-VPIX_n are respectively received by the comparators CP_1-CP_n of the image sensing circuit 10 based on the control of a row decoder 202. The comparators CP_1-CP_n may compare the image signals VPIX_1-VPIX_n with the ramp signal VRMP of the ramp generator 102 to generate the comparison results. In this embodiment, the ramp signal VRMP is a negative ramp signal having a negative slope, and the output signals VOUT_1-VOUT_n of the comparators CP_1-CP_n transit from low to high when the voltage of the ramp signal VRMP crosses the corresponding image signals VPIX_1-VPIX_n.

Conventionally, a rush current may be generated in each comparator CP_1-CP_n during the transition of the output signal VOUT_1-VOUT_n. If most of the image signals VPIX_1-VPIX_n are in an identical level, the output signals VOUT_1-VOUT_n may transit at substantially the same time, such that the rush current of the comparators CP_1-CP_n may be generated at substantially the same time. The simultaneous rush currents may draw a great amount of current from the power supply terminal, thereby generating a significant IR-drop on the power supply voltage AVDD. The rush currents may also generate an electromagnetic interference (EMI) problem.

Since the image sensor has the trends of a higher frame rate and larger resolution, the image sensing circuit 10 may have more channels for receiving the image signals (i.e., a larger number n), and the image signals may be received in a higher frequency. As a result, the overall peak current drawn from the power supply terminal may be larger, resulting in more severe IR-drop and EMI problems. The IR-drop may influence other devices or modules under the same power domain, i.e., the devices/modules operate by receiving the same power supply voltage. The IR-drop and EMI may also interfere with the received image signals, so as to generate row noises in the sensing results.

The rush current may be generated in a comparator if the comparator changes state while the ramp signal VRMP crosses the image signal VPIX. The principle is detailed as follows.

Figure 3:
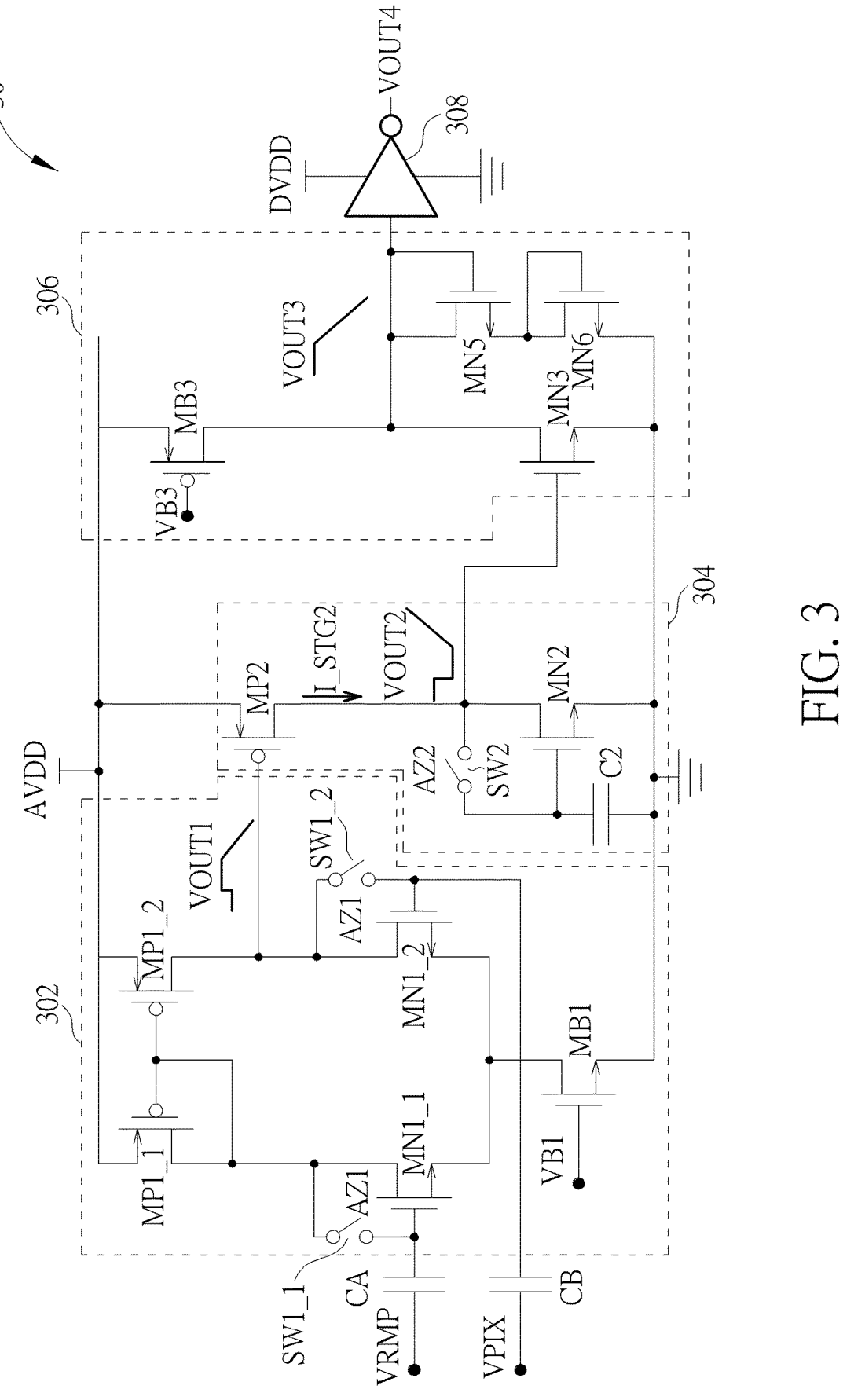
FIG. 3 is a schematic diagram of a comparator.

FIG. 3 is a schematic diagram of a comparator 30. The comparator 30 includes an input stage 302, a gain stage 304, an output stage 306 and an inverter 308. The comparator 30 may receive the input image signal VPIX and the ramp signal VRMP, to generate output signals VOUT1, VOUT2 and VOUT3 at the output terminals of the input stage 302, the gain stage 304 and the output stage 306, respectively. The inverter 308 is coupled to the output terminal of the output stage 306, for generating an output signal VOUT4.

Figure 4:
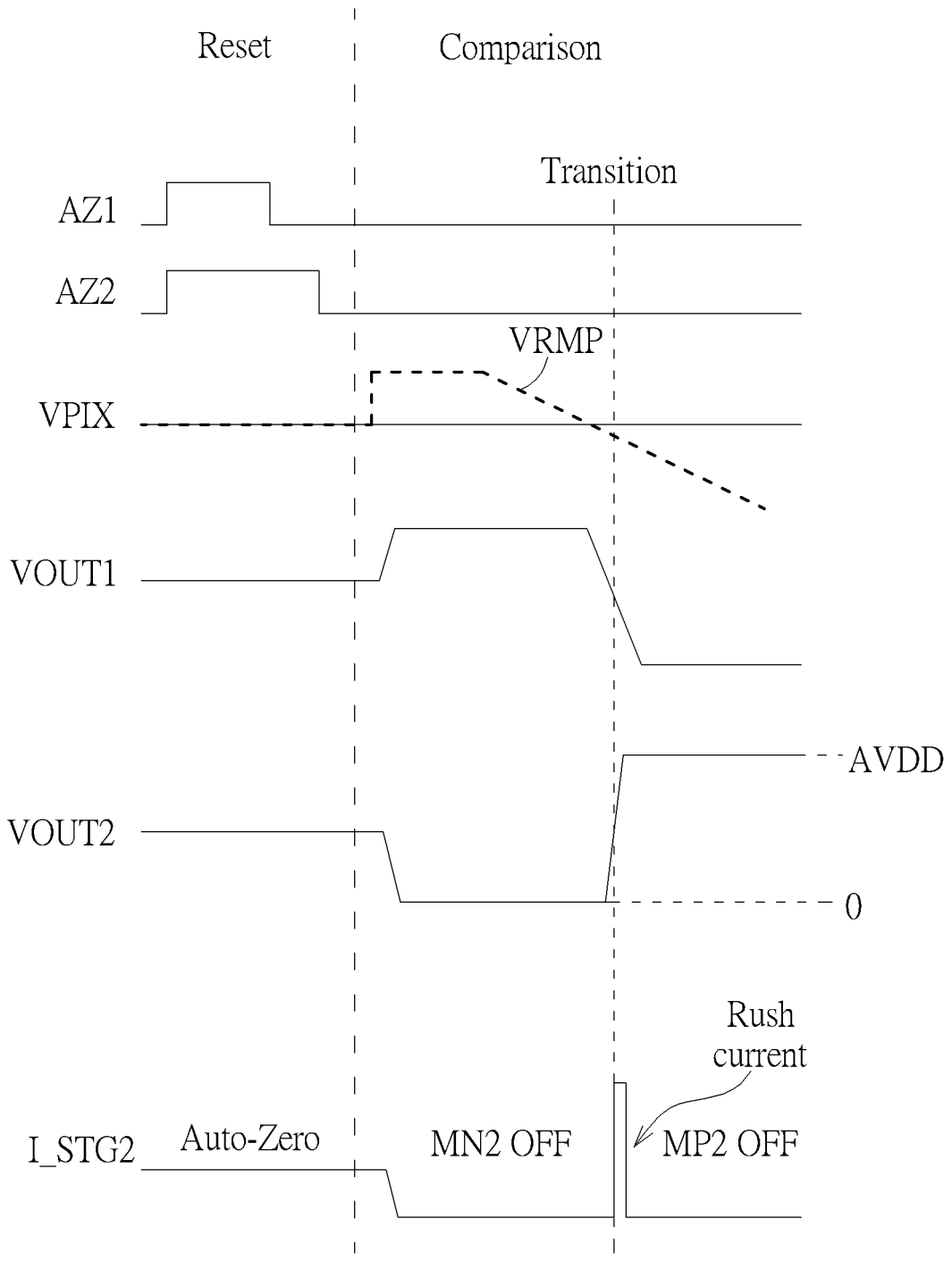
FIG. 4 is a waveform diagram of signals of the comparator.

FIG. 4 is a waveform diagram of signals of the comparator 30, where the control signals AZ1 and AZ2, the image signal VPIX, the ramp signal VRMP, the output signals VOUT1 and VOUT2, and the current I_STG2 of the gain stage 304 are illustrated. First, the comparator 30 operates in a reset phase, where the control signals AZ1 and AZ2 turn on the corresponding switches SW1_1, SW1_2 and SW2 to perform auto-zeroing. The auto-zeroing operation may reset the electric charges stored in the capacitors CA and CB.

After the end of the reset phase, the comparator 30 enters the comparison phase and starts to compare the image signal VPIX with the ramp signal VRMP. In the first steady state, since the image signal VPIX is smaller than the ramp signal VRMP, the output signal VOUT1 is high and the output signal VOUT2 is low. Subsequently, the ramp signal VRMP falls and crosses the image signal VPIX; and at this moment, the voltage signal VOUT1 transits from high to low and the voltage signal VOUT2 transits from low to high. The comparator 30 then enters another steady state, where the voltage signal VOUT1 is low and the voltage signal VOUT2 is high.

In the first steady state before transition, the voltage of the output signal VOUT1 may be equal to the power supply voltage AVDD and the voltage of the output signal VOUT2 may be equal to the ground voltage 0, where the transistor MN2 is turned off and the current I_STG2 of the gain stage 304 will be equal to 0. In the second steady state after transition, the output signal VOUT1 may be equal to the ground voltage 0 and the output signal VOUT2 may be equal to the power supply voltage AVDD, where the transistor MP2 is turned off and the current I_STG2 of the gain stage 304 will be equal to 0. Therefore, at the transition time of the output signals VOUT1 and VOUT2, a large rush current may be generated at the gain stage 304; that is, the current I_STG2 may appear to have a large peak at this moment. As mentioned above, this rush current may simultaneously appear at each of the comparators in the image sensing circuit, and therefore draw a large peak current from the power supply terminal to cause the IR-drop and EMI, especially when there are a great number of comparators included in the image sensing circuit.

In order to solve this problem, the present invention provides a novel comparator structure, which applies a clamp circuit coupled to the gain circuit, to clamp the voltage of the output signal VOUT2, so as to prevent the rush current at the voltage transition time.

Figure 5:
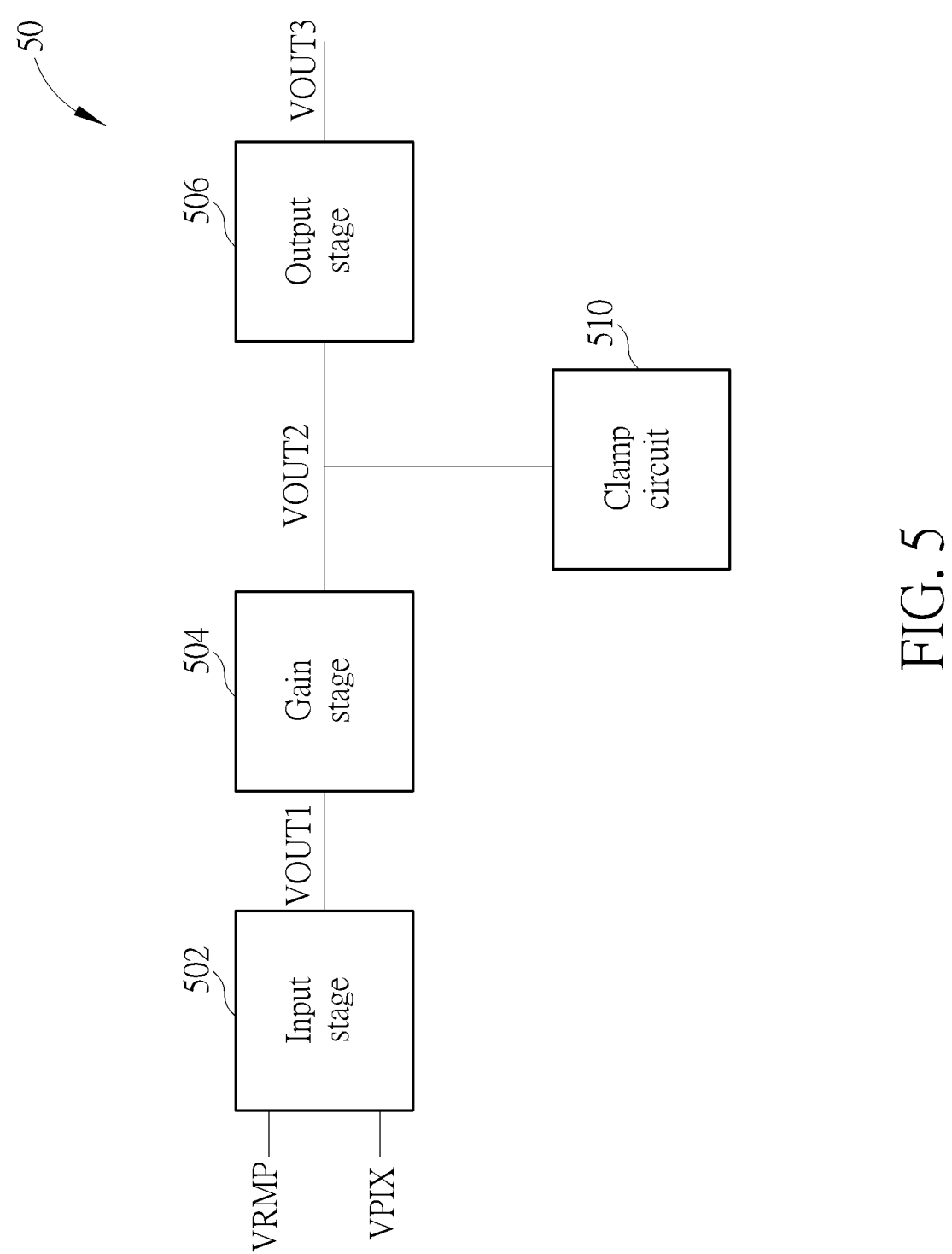
FIG. 5 is a schematic diagram of a comparator according to an embodiment of the present invention.

FIG. 5 is a schematic diagram of a comparator 50 according to an embodiment of the present invention. The comparator 50 includes an input stage 502, a gain stage 504, an output stage 506 and a clamp circuit 510. The input stage 502 is configured to receive the input image signal VPIX and the ramp signal VRMP to generate an output signal VOUT1. The gain stage 504 is configured to receive the output signal VOUT1 to generate an output signal VOUT2. The output stage 506 is configured to receive the output signal VOUT2 to generate an output signal VOUT3. The clamp circuit 510, which is coupled to the gain stage 504 and the output stage 506, may clamp the voltage of the output signal VOUT2, in order to cancel or reduce the rush current in the gain stage 504.

Figure 6:
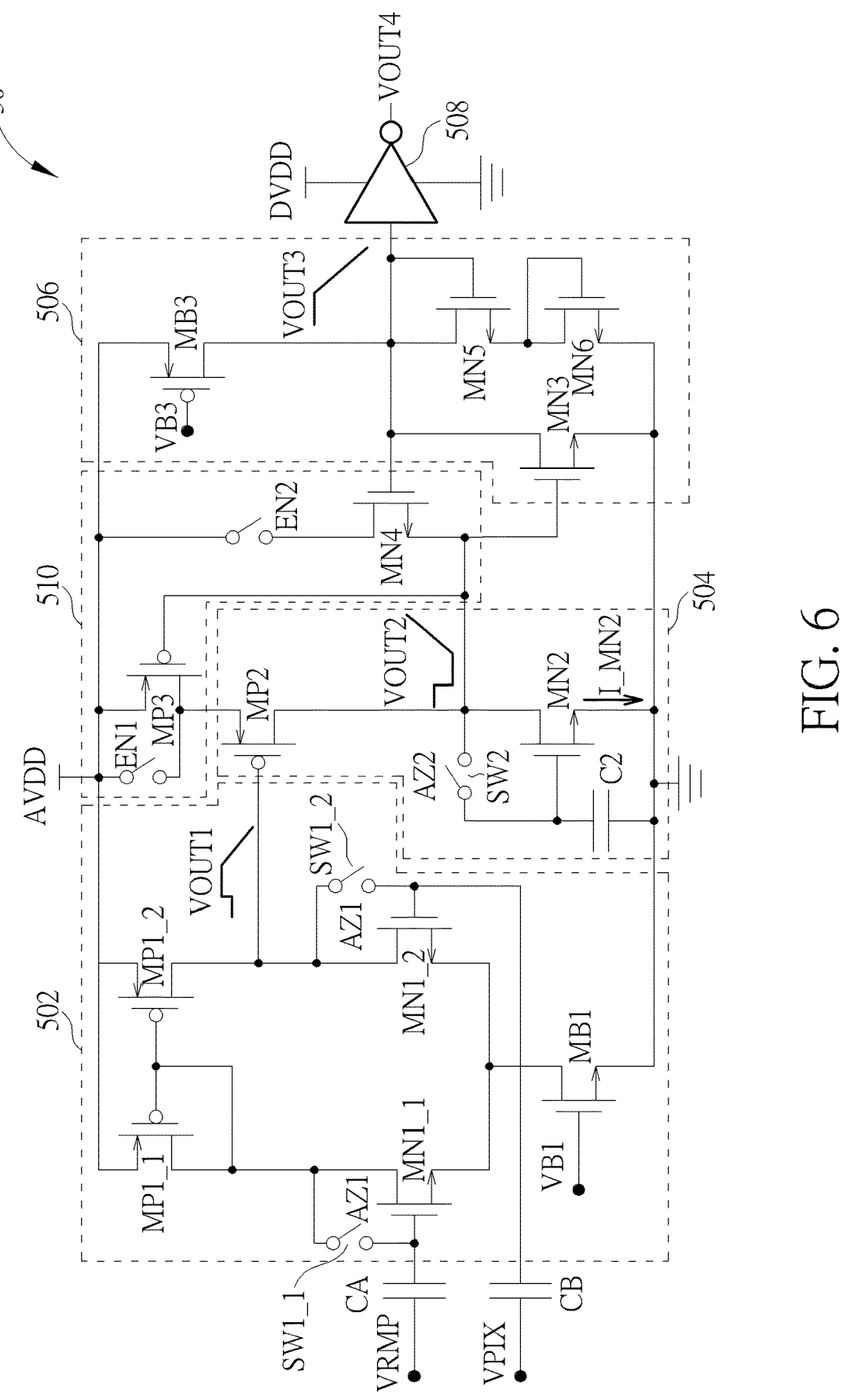
FIG. 6 illustrates a detailed implementation of the comparator shown in FIG. 5.

FIG. 6 illustrates a detailed implementation of the comparator 50, where the transistor-level structure of the comparator 50 is shown. The comparator 50 is configured to compare the ramp signal VRMP with the image signal VPIX to generate the output signals VOUT1-VOUT4 in different stages. The implementations and operations of the input stage 502, the gain stage 504 and the output stage 506 shown in FIG. 6 are similar to those of the input stage 302, the gain stage 304 and the output stage 306 shown in FIG. 3; hence, the signals and elements therein having similar functions are denoted by the same symbols. The clamp circuit 510 is coupled to the gain stage 504 and the output stage 506, for clamping the output signal VOUT2 generated by the gain stage 504 to be within an appropriate level, so as to prevent the rush current generated in the gain stage 504. The comparator 50 is operated by receiving a power supply voltage AVDD.

FIG. 6 also illustrates an inverter 508, which may be included in the comparator 50 or coupled to the output terminal of the comparator 50, for inverting the output signal VOUT3 to generate the final output signal VOUT4. The inverter 508 is operated by receiving another power supply voltage DVDD.

As shown in FIG. 6, the input stage 502 includes an input pair MN1_1 and MN1_2, a current mirror MP1_1 and MP1_2, a bias transistor MB1, and two switches SW1_1 and SW1_2. The input pair MN1_1 and MN1_2 are configured to receive the ramp signal VRMP and the image signal VPIX, respectively. The bias transistor MB1 may receive a bias voltage VB1. The switches SW1_1 and SW1_2, which are coupled to the input pair MN1_1 and MN1_2, respectively, are controlled by the control signal AZ1 for auto-zeroing. The input stage 502 may operate as a differential to single-ended converter to convert the image signal VPIX and the ramp signal VRMP into the output signal VOUT1.

In addition, FIG. 6 also illustrates two capacitors CA and CB coupled to the input terminals of the comparator 50. These capacitors CA and CB may be considered as being included in the comparator 50 or deployed in front of the input terminals of the comparator 50. With the deployment of the capacitors CA and CB, the ramp signal VRMP may be coupled to the gate terminal of the input transistor MN1_1 through the capacitor CA, and the image signal VPIX may be coupled to the gate terminal of the input transistor MN1_2 through the capacitor CB. In an embodiment, the comparator 50 may be any of the comparators CP_1-CP_n of the image sensing circuit 10 shown in FIG. 1. Therefore, the capacitor CA may be any of the capacitors CA_1-CA_n, and the capacitor CB may be any of the capacitors CB_1-CB_n.

The gain stage 504 includes a high-side transistor MP2, a low-side transistor MN2, a switch SW2 and a capacitor C2. The switch SW2 is controlled by the control signal AZ2 for auto-zeroing, to reset the electric charges stored in the capacitor C2. The high-side transistor MP2 and the low-side transistor MN2 of the gain stage 502 may form an inverter for inverting the output signal VOUT1 to generate the output signal VOUT2.

The output stage 506 includes several transistors MB3, MN3, MN5 and MN6. The transistor MB3 receives a bias voltage VB3. The transistor MN3 may serve as an inverter for inverting the output signal VOUT2 to generate the output signal VOUT3. The transistors MN5 and MN6 are diode-connected, which provide a voltage for clamping the level of the output signal VOUT3.

As shown in FIG. 6, the clamp circuit 510 includes two enable switches EN1 and EN2 and two clamp transistors MP3 and MN4. The enable switches EN1 and EN2 are configured to control the enablement of the clamp transistors MP3 and MN4, respectively. The clamp transistors MP3 and MN4 are configured to clamp the voltage of the output signal VOUT2. The clamp transistor MP3 is coupled between the high-side transistor MP2 and the power supply terminal that supplies the power supply voltage AVDD. The clamp transistor MN4 is coupled between the gain stage 504 and the output stage 506. The clamp transistors MN4 and MP3 along with other transistors MN5, MN6 and MP2 in the comparator 50 may form a negative feedback loop to prevent the occurrence of rush current.

In detail, the clamp transistor MP3 is a P-type metal oxide semiconductor (PMOS) transistor, where the drain terminal of the clamp transistor MP3 is coupled to the source terminal of the transistor MP2, the source terminal of the clamp transistor MP3 is coupled to the power supply terminal, and the gate terminal of the clamp transistor MP3 is coupled to the output terminal of the gain stage 504. The clamp transistor MP3 may clamp the output signal VOUT2 to have an upper limit lower than the power supply voltage AVDD.

The clamp transistor MN4 is an N-type metal oxide semiconductor (NMOS) transistor, where the drain terminal of the clamp transistor MN4 is coupled to the power supply terminal, the source terminal of the clamp transistor MN4 is coupled to the output terminal of the gain stage 504, and the gate terminal of the clamp transistor MN4 is coupled to the output stage 506. The clamp transistor MN4 may clamp the output signal VOUT2 to have a lower limit higher than the ground voltage 0.

The enable switch EN1 is coupled between the drain terminal of the clamp transistor MP3 and the power supply terminal, to control the enablement of the clamp transistor MP3. In this embodiment, the clamp transistor MP3 is enabled only when the enable switch EN1 is cut off. In another embodiment, the enable switch EN1 may be omitted and thus the clamping function of the clamp transistor MP3 will be always on.

The enable switch EN2 is coupled between the clamp transistor MN4 and the power supply terminal, to control the enablement of the clamp transistor MN4. In this embodiment, the clamp transistor MN4 is enabled only when the enable switch EN2 is conducted. In another embodiment, the enable switch EN2 may be omitted and thus the clamping function of the clamp transistor MN4 will be always on.

Figure 7:
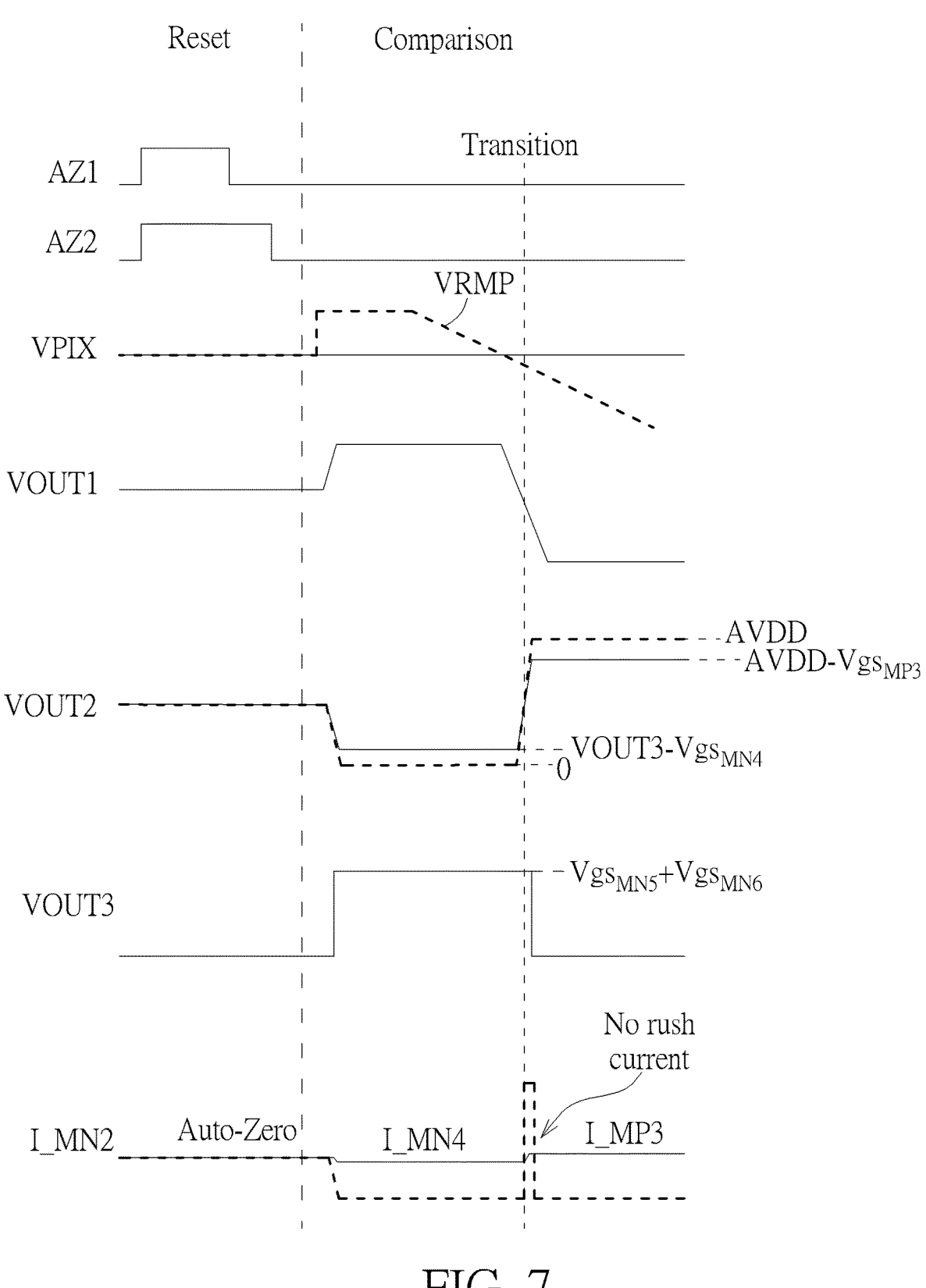
FIG. 7 is a waveform diagram of signals of the comparator.

FIG. 7 is a waveform diagram of signals of the comparator 50, where the control signals AZ1 and AZ2, the image signal VPIX, the ramp signal VRMP, the output signals VOUT1, VOUT2 and VOUT3, and the current I_MN2 flowing through the transistor MN2 are illustrated. Several signal waveforms of the comparator 30 are also shown as dotted lines in FIG. 7 for comparison. Similar to the operations of the comparator 30 as shown in FIG. 4, the operations of the comparator 50 also include a reset phase and a comparison phase. The control signals AZ1 and AZ2 turn on the corresponding switches to perform auto-zeroing in the reset phase. The image signal VPIX is compared with the ramp signal VRMP to generate a voltage transition and obtain a comparison result in the comparison phase.

In the reset phase, the switches SW1_1 and SW1_2 are turned on by the control signal AZ1 and the switch SW2 is turned on by the control signal AZ2, to generate an auto-zeroing current in the input stage 502 and the gain stage 504. The auto-zeroing current in the gain stage 504 may generate a voltage across the capacitor C2, and the related electric charges are stored in the capacitor C2. Since the capacitor C2 is coupled between the gate terminal and the source terminal of the transistor MN2, the cross voltage of the capacitor C2 may be equal to the gate-to-source voltage $Vgs_{MN2}$ of the transistor MN2.

Subsequently, the comparator 50 enters the comparison phase. In the first steady state before voltage transition, the output signal VOUT1 is high and the output signal VOUT2 is low. Although the high-side transistor MP2 may be turned off by the output signal VOUT1, the clamp transistor MN4 may still provide a current flowing to the low-side transistor MN2, so as to keep the low-side transistor MN2 on and operated in the saturation region. Since the capacitor C2 may keep the gate-to-source voltage $Vgs_{MN2}$ of the transistor MN2 consistent, the current I_MN2 flowing through the transistor MN2 may keep at a level approximately equal to the auto-zeroing current in the reset phase, and this current I_MN2 may be supplied from the clamp transistor MN4 (i.e., I_MN4). In such a situation, the output signal VOUT2 may not fall to ground; instead, the voltage of the output signal VOUT2 may be clamped at a low level equal to $VOUT3-Vgs_{MN4}$, i.e., the output signal VOUT3 minus the gate-to-source voltage of the clamp transistor MN4.

Note that the low level $VOUT3-Vgs_{MN4}$ of the output signal VOUT2 may be determined by controlling the voltage level of the output signal VOUT3. As shown in FIG. 6, there are two diode-connected transistors MN5 and MN6 coupled between the output terminal of the output stage 506 and the ground terminal, so as to provide twice gate-to-source voltages (i.e., $Vgs_{MN5}+Vgs_{MN6}$) for the output signal VOUT3. Note that the deployment of the transistors MN5 and MN6 is merely one of various implementations of the present invention. In another embodiment, the transistors MN5 and MN6 may apply PMOS transistors, or may be replaced by one or more diodes and/or resistors. The number of diodes or diode-connected transistors or the resistance values of the resistors may be set in an appropriate manner according to the voltage requirement of the output signal VOUT3.

In the second steady state after voltage transition, the output signal VOUT1 is low and the output signal VOUT2 is high. At this moment, the high-side transistor MP2 may be operated in the linear region to serve as a switch, which provides a current (i.e., I_MP3) to flow to the transistor MN2 as the current I_MN2. Similarly, since the capacitor C2 may keep the gate-to-source voltage $Vgs_{MN2}$ Of the transistor MN2 consistent, the current I_MN2 may keep at a level approximately equal to the auto-zeroing current in the reset phase and the current in the first steady state. In such a situation, the output signal VOUT2 will not reach the power supply voltage AVDD due to the clamping of the clamp transistor MP3; instead, the voltage of the output signal VOUT2 may be clamped at a high level equal to AVDD-$Vgs_{MP3}$, i.e., the power supply voltage AVDD minus the gate-to-source voltage of the clamp transistor MP3.

Different from the comparator 30 where the output signal VOUT2 reaches the power supply voltage AVDD and the high-side transistor MP2 is turned off to make the current of the gain stage 304 reach 0, there is still a current approximately equal to the auto-zeroing current in the gain stage 504 of the comparator 50 in the second steady state. Also, different from the comparator 30 where the output signal VOUT2 reaches ground and the low-side transistor MN2 is turned off to make the current of the gain stage 304 reach 0, there is still a current approximately equal to the auto-zeroing current in the gain stage 504 of the comparator 50 in the first steady state. Therefore, no matter whether the voltage signal VOUT2 is at the high level or low level, the transistor MN2 keeps on and operates in the saturation region to keep its current unchanged, so that there will be no rush current in the gain stage 504. This solves the IR-drop and EMI problems in the prior art.

Please note that the present invention aims at providing a novel comparator structure for an image sensing circuit. Those skilled in the art may make modifications and alterations accordingly. For example, the structures of the input stage 502, the gain stage 504 and the output stage 506 shown in FIG. 6 are merely an example, and may be modified appropriately according to system requirements. Also, in the embodiment shown in FIG. 6, the clamp circuit 510 uses a clamp transistor MP3 to clamp the upper limit of the output signal VOUT2 of the gain stage 504 and uses another clamp transistor MN4 to clamp the lower limit of the output signal VOUT2 of the gain stage 504. In another embodiment, there may be only one clamp transistor included in the clamp circuit, to clamp one of the upper limit and the lower limit of the output signal. The rush current may also be reduced if the output signal is clamped at one side.

In addition, the comparator structure of the present invention may be implemented in any image sensing circuit, which may be used to process image signals of any type of image sensor. This image sensor may be a complementary metal oxide semiconductor (CMOS) image sensor, but not limited thereto.

Figure 8:
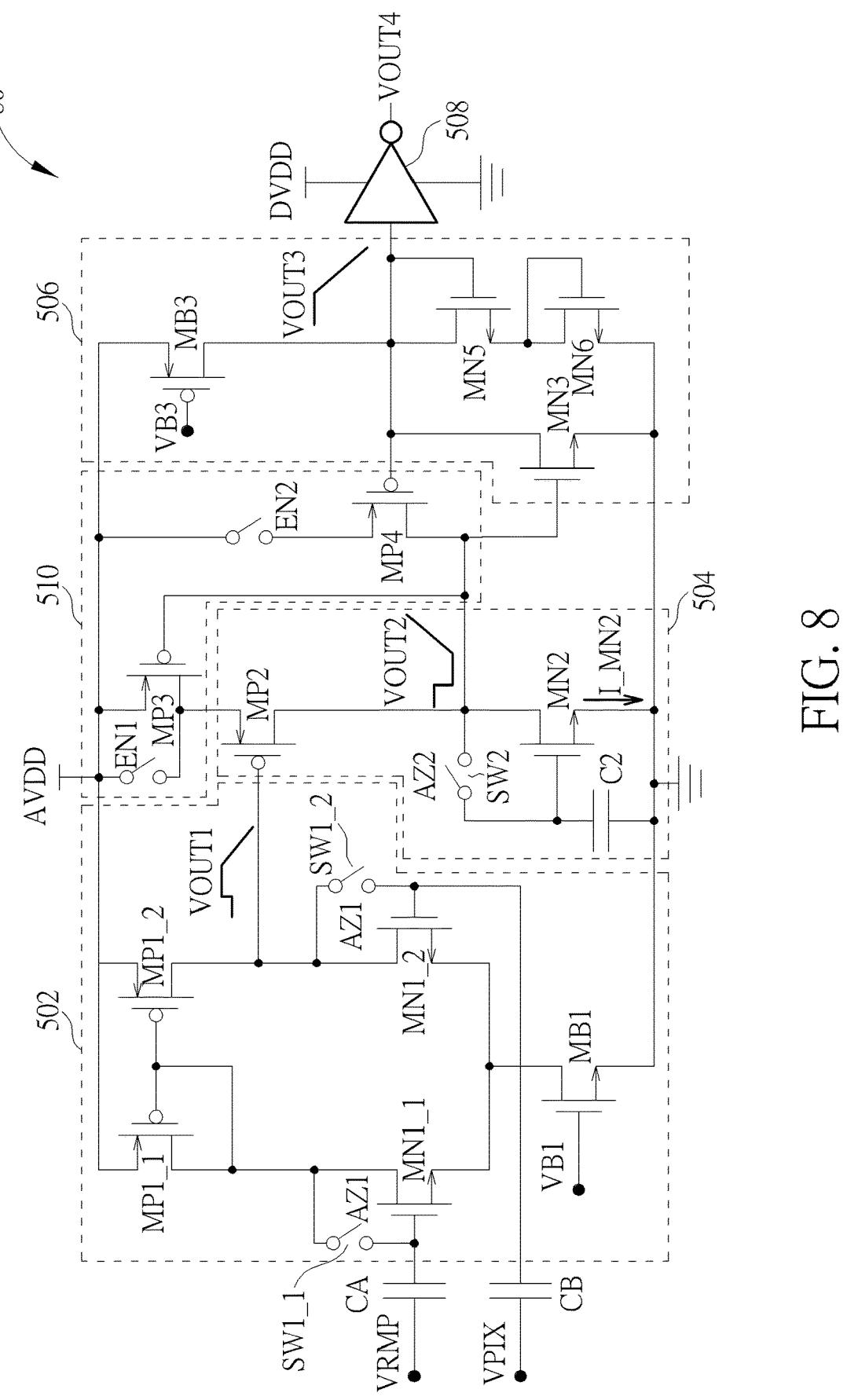
FIG. 8 is a schematic diagram of a comparator according to an embodiment of the present invention.

FIG. 8 is a schematic diagram of a comparator 80 according to an embodiment of the present invention. The structure of the comparator 80 is similar to the structure of the comparator 50 shown in FIG. 6, so signals and elements having similar functions are denoted by the same symbols.

The difference between the comparator 80 and the comparator 50 is that, in the comparator 80, the NMOS transistor MN4 of the clamp circuit 510 is replaced by a PMOS transistor MP4. In other words, in the comparator 80, the clamp transistor used for clamping the lower limit of the output signal VOUT2 applies a PMOS transistor. As shown in FIG. 8, the source terminal of the clamp transistor MP4 is coupled to the power supply terminal, the drain terminal of the clamp transistor MP4 is coupled to the output terminal of the gain stage 504, and the gate terminal of the clamp transistor MP4 is coupled to the output stage 506.

If the PMOS clamp transistor MP4 is applied, the clamp circuit 510 may generate a positive feedback loop to accelerate the voltage transition when the ramp signal VRMP crosses the image signal VPIX. In such a situation, the transition times in different comparators of the image sensing circuit may be scattered, so that the rush currents in different comparators may also be scattered, so as to reduce the overall ripple and IR-drop appearing in the power supply voltage AVDD.

Figure 9:
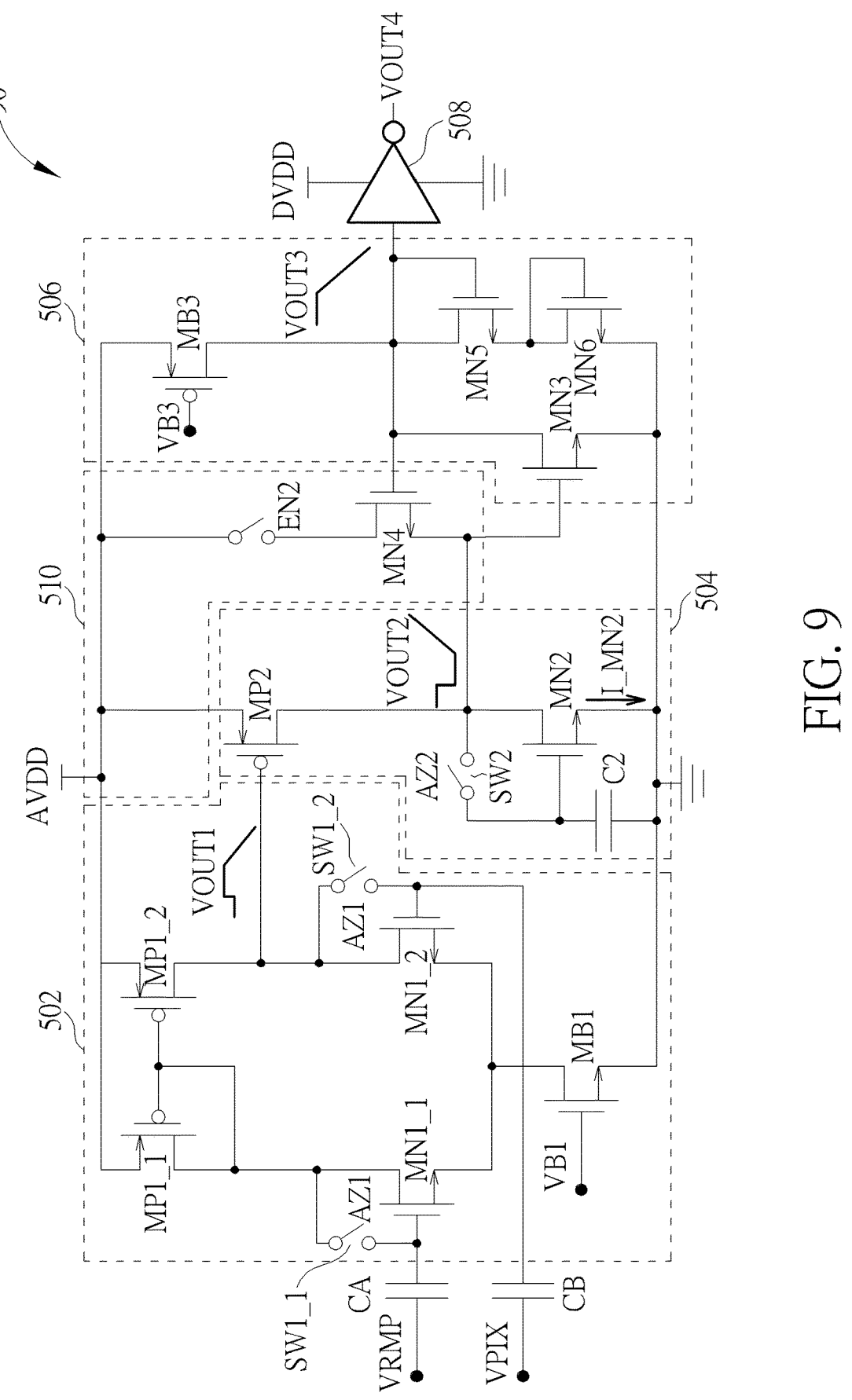
FIG. 9 is a schematic diagram of another comparator according to an embodiment of the present invention.

FIG. 9 is a schematic diagram of another comparator 90 according to an embodiment of the present invention. The structure of the comparator 90 is similar to the structure of the comparator 50 shown in FIG. 6, so signals and elements having similar functions are denoted by the same symbols. The difference between the comparator 90 and the comparator 50 is that, the clamp circuit 510 of the comparator 90 only includes the enable switch EN2 and the clamp transistor MN4, where the enable switch EN1 and the clamp transistor MP3 are omitted. In this implementation, the output signal VOUT2 may be clamped at a lower limit which is higher than the ground voltage 0 and the low-side transistor MN2 may not be turned off before the voltage transition time, so as to reduce the rush current generated during the voltage transition.

Note that the structure of the comparator 90 may further be altered by replacing the NMOS clamp transistor MN4 with a PMOS clamp transistor MP4, or by removing the enable switch EN2. The related implementations should belong to the scope of the present invention.

Figure 10:
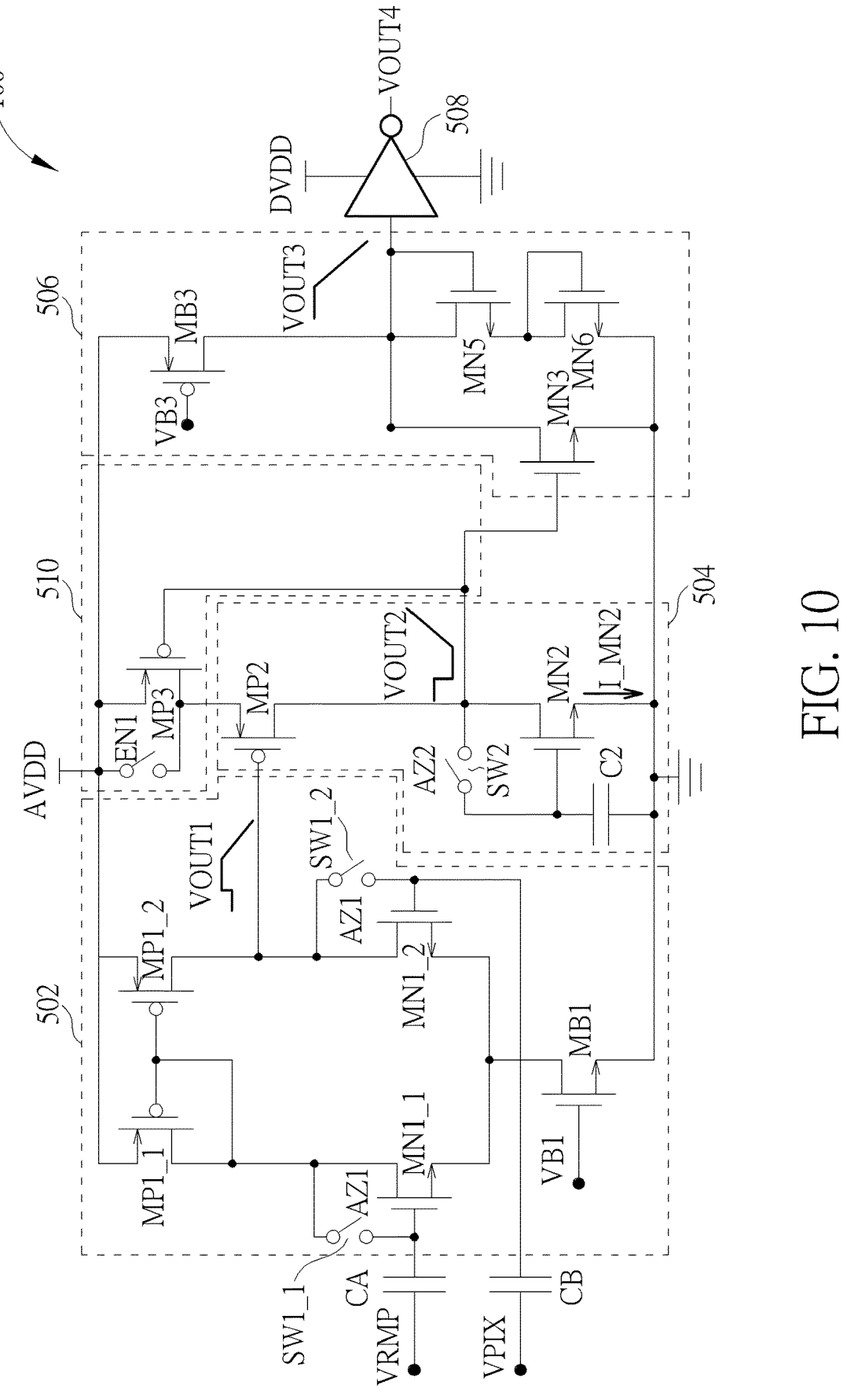
FIG. 10 is a schematic diagram of a further comparator according to an embodiment of the present invention.

FIG. 10 is a schematic diagram of a further comparator 100 according to an embodiment of the present invention. The structure of the comparator 100 is similar to the structure of the comparator 50 shown in FIG. 6, so signals and elements having similar functions are denoted by the same symbols. The difference between the comparator 100 and the comparator 50 is that, the clamp circuit 510 of the comparator 100 only includes the enable switch EN1 and the clamp transistor MP3, where the enable switch EN2 and the clamp transistor MN4 are omitted. In this implementation, the output signal VOUT2 may be clamped at an upper limit which is lower than the power supply voltage AVDD and the high-side transistor MP2 may not be turned off after the voltage transition time, so as to reduce the rush current generated during the voltage transition.

Note that the structure of the comparator 100 may further be altered by removing the enable switch EN1. The related implementations should belong to the scope of the present invention.

To sum up, the present invention provides a novel comparator structure for an image sensing circuit. The comparator has a clamp circuit, which may include a first clamp transistor to clamp an upper limit of the output signal of the gain stage to be lower than the power supply voltage, and/or include a second clamp transistor to clamp a lower limit of the output signal of the gain stage to be higher than the ground voltage. Therefore, the low-side transistor of the gain stage may be always on and keep operating in the saturation region, so as to keep a constant current in the gain stage during the voltage transition and the steady states; hence, the rush current may not appear at the voltage transition time where the ramp signal crosses the input image signal. The IR-drop and EMI problems of the image sensing circuit may thereby be solved. The clamp circuit of the present invention may only require one or two additional transistors included in each comparator, and the structure is quite simple and may be easily implemented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A comparator, comprising:
an input stage to receive an input signal and a ramp signal and generate a first output signal;
a gain stage, coupled to the input stage, to receive the first output signal and generate a second output signal;
an output stage, coupled to the gain stage, to receive the second output signal and generate a third output signal; and
a clamp circuit, coupled to the gain stage and the output stage, to clamp the second output signal to have an upper limit lower than a power supply voltage of the comparator, so that the second output signal is prevented from being higher than the upper limit.

2. The comparator of claim 1, wherein the gain stage comprises a high-side transistor and a low-side transistor, and the clamp circuit comprises:
a first clamp transistor, coupled between the high-side transistor and a power supply terminal of the comparator.

3. The comparator of claim 2, wherein a drain terminal of the first clamp transistor is coupled to the high-side transistor, a source terminal of the first clamp transistor is coupled to the power supply terminal, and a gate terminal of the first clamp transistor is coupled to an output terminal of the gain stage.

4. The comparator of claim 2, wherein the first clamp transistor is a P-type metal oxide semiconductor (PMOS) transistor.

5. The comparator of claim 2, wherein the clamp circuit further comprises a first enable switch, coupled between the first clamp transistor and the power supply terminal.

6. The comparator of claim 2, wherein the first clamp transistor clamps the second output signal to have the upper limit.

7. The comparator of claim 1, wherein the clamp circuit comprises:
a second clamp transistor, coupled between the gain stage and the output stage.

8. The comparator of claim 7, wherein a first terminal of the second clamp transistor is coupled to an output terminal of the gain stage, a second terminal of the second clamp transistor is coupled to a power supply terminal of the comparator, and a gate terminal of the second clamp transistor is coupled to the output stage.

9. The comparator of claim 7, wherein the second clamp transistor is a PMOS transistor.

10. The comparator of claim 7, wherein the second clamp transistor is an N-type metal oxide semiconductor (NMOS) transistor.

11. The comparator of claim 7, wherein the clamp circuit further comprises a second enable switch, coupled between the second clamp transistor and a power supply terminal of the comparator.

12. The comparator of claim 7, wherein the second clamp transistor clamps the second output signal to have a lower limit higher than a ground voltage.

13. The comparator of claim 1, wherein the gain stage comprises a high-side transistor and a low-side transistor, and the low-side transistor keeps on when the second output signal is at a high level and when the second output signal is at a low level.

14. An image sensing circuit, having a plurality of input channels, the image sensing circuit comprising:
a ramp generator to generate a ramp signal; and
a plurality of comparators, each comprising:
an input stage, coupled to the ramp generator and one of the plurality of input channels, to receive an input signal from the coupled input channel and receive the ramp signal from the ramp generator, and generate a first output signal;
a gain stage, coupled to the input stage, to receive the first output signal and generate a second output signal; and
an output stage, coupled to the gain stage, to receive the second output signal and generate a third output signal; and
a clamp circuit, coupled to the gain stage and the output stage, to clamp the second output signal to have an upper limit lower than a power supply voltage of the comparator, so that the second output signal is prevented from being higher than the upper limit.

15. The image sensing circuit of claim 14, wherein the gain stage comprises a high-side transistor and a low-side transistor, and the clamp circuit comprises:
a first clamp transistor, coupled between the high-side transistor and a power supply terminal of the comparator.

16. The image sensing circuit of claim 15, wherein a drain terminal of the first clamp transistor is coupled to the high-side transistor, a source terminal of the first clamp transistor is coupled to the power supply terminal, and a gate terminal of the first clamp transistor is coupled to an output terminal of the gain stage.

17. The image sensing circuit of claim 15, wherein the first clamp transistor is a P-type metal oxide semiconductor (PMOS) transistor.

18. The image sensing circuit of claim 15, wherein the clamp circuit further comprises a first enable switch, coupled between the first clamp transistor and the power supply terminal.

19. The image sensing circuit of claim 15, wherein the first clamp transistor clamps the second output signal to have the upper limit.

20. The image sensing circuit of claim 14, wherein the clamp circuit comprises:
a second clamp transistor, coupled between the gain stage and the output stage.

21. The image sensing circuit of claim 20, wherein a first terminal of the second clamp transistor is coupled to an output terminal of the gain stage, a second terminal of the second clamp transistor is coupled to a power supply terminal of the comparator, and a gate terminal of the second clamp transistor is coupled to the output stage.

22. The image sensing circuit of claim 20, wherein the second clamp transistor is a PMOS transistor.

23. The image sensing circuit of claim 20, wherein the second clamp transistor is an N-type metal oxide semiconductor (NMOS) transistor.

24. The image sensing circuit of claim 20, wherein the clamp circuit further comprises a second enable switch, coupled between the second clamp transistor and a power supply terminal of the comparator.

25. The image sensing circuit of claim 20, wherein the second clamp transistor clamps the second output signal to have a lower limit higher than a ground voltage.

26. The image sensing circuit of claim 14, wherein the gain stage comprises a high-side transistor and a low-side transistor, and the low-side transistor keeps on when the second output signal is at a high level and when the second output signal is at a low level.

27. The image sensing circuit of claim 14, further comprising:

a plurality of counters, each coupled to an output terminal of one of the plurality of comparators.

* * * * *